United States Patent [19]

Dost et al.

[11] 3,914,050

[45] Oct. 21, 1975

[54] POSITIVE SELECTIVE NICKEL ALIGNMENT SYSTEM

[75] Inventors: Richard W. Dost; James L. Hudson; Larry L. Jordan, all of Kokomo, Ind.

[73] Assignee: General Motors Corporation, Detroit, Mich.

[22] Filed: May 24, 1973

[21] Appl. No.: 363,488

[52] U.S. Cl. .............................................. 355/133
[51] Int. Cl.² .......................................... G03B 41/00
[58] Field of Search ............... 117/212; 355/75, 133

[56] References Cited

UNITED STATES PATENTS

| | | | |
|---|---|---|---|
| 3,667,989 | 6/1972 | Keating | 427/282 |
| 3,738,877 | 6/1973 | Davisohn | 148/187 X |

*Primary Examiner*—John M. Horan
*Attorney, Agent, or Firm*—Robert J. Wallace

[57] ABSTRACT

An alignment assembly for masking and a process for depositing a metallic coating on selected areas on the back side of a semiconductor wafer. The assembly and process involves a distinctive alignment chuck having a pattern of grooves therein and a mask aligned with the chuck. In the method, a photomask for the back side of the wafer is aligned with the grooves in the chuck, a wafer nested face down in the chuck, and the mask moved into contact with the back side of the wafer. The front side of the wafer has a pattern of ridges that nest in the chuck grooves to align the wafer in the chuck. A photoresist layer on the back side of the wafer is subjected to an ultraviolet light through the photomask. Unexposed areas of photoresist are removed to expose selected areas on the back side of the wafer on which a metallic coating can be deposited.

1 Claim, 4 Drawing Figures

POSITIVE SELECTIVE NICKEL ALIGNMENT SYSTEM

BACKGROUND OF THE INVENTION

This invention relates to an alignment assembly for photomasking the back side of a semiconductor wafer relative to its front side, and to a method of using this assembly to deposit a metallic coating on selected areas of the wafer back side. More particularly, this invention relates to an assembly in which a photomask for the back side of a semiconductor wafer is automatically registered with particular regions on the wafer front side by nesting a pattern of ridges on the wafer front side with grooves in a distinctive alignment chuck.

In some applications, it is desirable to have a metallic coating on the collector region or back side of discrete semiconductor dies. These metallic coatings serve as solderable areas, or electrodes, by which a low resistance electrical connection can be made to the collector region. In most cases, it is economically advantageous to apply such a coating to the discrete dies before they are separated from the wafer in which they are made.

One widely used method of separating the discrete dies from the wafer involves chemical etching. In this method, one etches a grid pattern completely through the wafer, thus producing a plurality of discrete dies. In such instance, it is convenient for one to cover the entire back side of the wafer with a blanket nickel coating. One then etches completely through the wafer and the nickel coating to form a plurality of discrete dies with each die having a nickel coating on its back side. This may be satisfactory for dies containing planar type devices.

On the other hand, we have noted that if the dies contain mesa devices, the collector-base junctions of the mesa dies are exposed during etching. We also noted that since part of the nickel coating is etched away during dicing, it contaminates the etch solution. The dissolved nickel can deposit on the exposed collector-base junctions resulting in an instability in the junction. The present invention prevents such metallic ions from contaminating the etch solution, and yet permits one to use the conventional etch-out technique of separating nickel coated dies from a wafer. More particularly, the present invention provides an inexpensive and reliable means for selectively depositing the nickel coating outside the grid etch-out lines.

In the pending patent application, U.S. Ser. No. 325,227, Hudson et al., it was disclosed that one could form a pattern of ridges on the emitter face of a semiconductor wafer during the same process in which mesa emitters were formed. The above mentioned patent application utilizes this pattern of ridges in connection with a wax spray mask for the front side of the wafer. The spray mask has grooves which correspond to the pattern of ridges. The spray mask interlocks with the wafer and allows selective deposition of wax on the mesa emitters on the front side of the semiconductor wafer.

This present invention makes use of these same wafer ridges to facilitate precise registry of selected regions in a photomask for the back side of the wafer with emitter regions on the front side of the wafer. In this way, a metallic coating can be applied to selected areas on the back side of the wafer between the etch-out grid lines and avoid etching the nickel coating during die separation.

OBJECTS AND SUMMARY OF THE INVENTION

It is an object of this invention to provide an assembly that facilitates masking a back side of a semiconductor wafer in precise alignment with particular regions on the wafer front side.

Another object of this invention is to provide an improved method of applying a metallic coating on selected areas on the back side of a semiconductor wafer.

Another object of this invention is to permit the use of conventional etch-out techniques for releasing individual mesa dies having a nickel coating on their collector region from a wafer without contaminating the collector-base junction.

This invention involves an alignment assembly and a related process for masking and depositing a metallic coating on selected areas on the back side of a semiconductor wafer. The assembly includes a distinctive alignment chuck having grooves therein. A photomask is aligned with the chuck grooves and secured to means for repetitively abutting a back side of semiconductor wafers successively nested in the chuck, while retaining original alignment with the chuck. The wafers have a pattern of ridges on their front sides which are nested in the chuck grooves, thereby assuring positive alignment of the wafers in the chuck, and automatic registration of the photomask with particular regions on the wafer front side. The back sides of the wafers are coated with a photoresist, which is subjected to an ultraviolet light through the photomask. The unexposed photoresist areas are removed to expose selected areas on the wafer back side on which a metallic coating can be deposited.

DESCRIPTION OF THE PREFERRED EMBODIMENT

Figure 1:
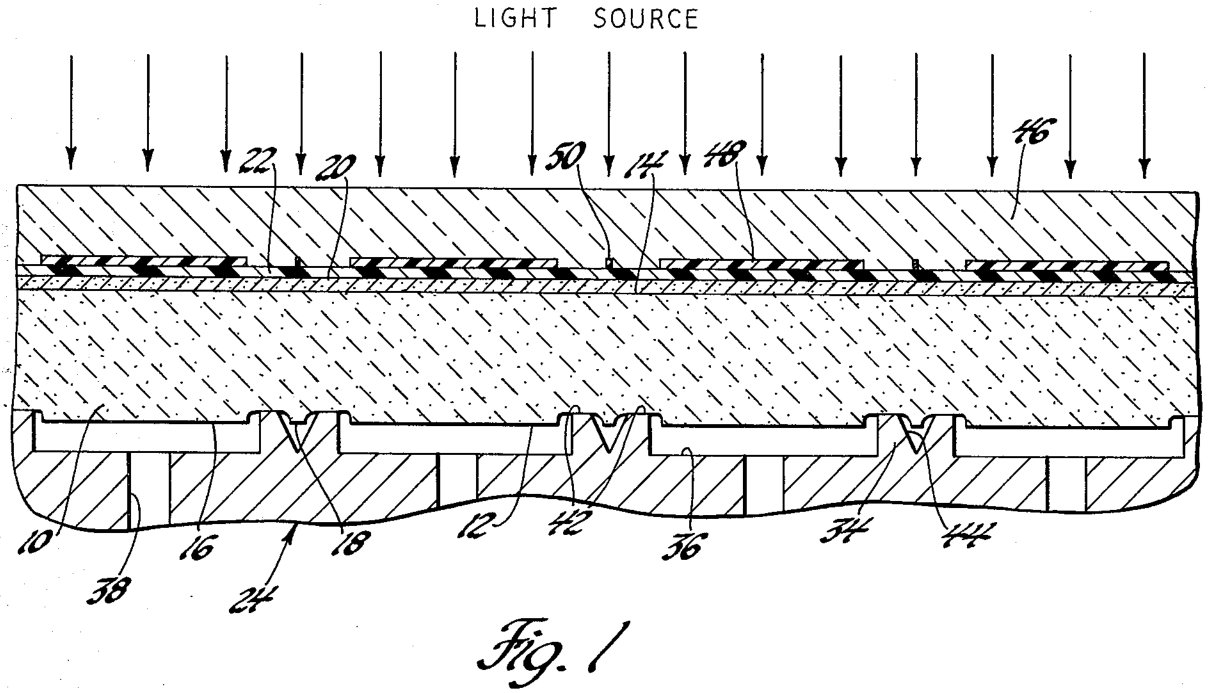
FIG. 1 is an enlarged fragmentary sectional view showing an alignment chuck, a semiconductor wafer nested in it, and a photomask on the wafer, all in positive alignment.
Figure 2:
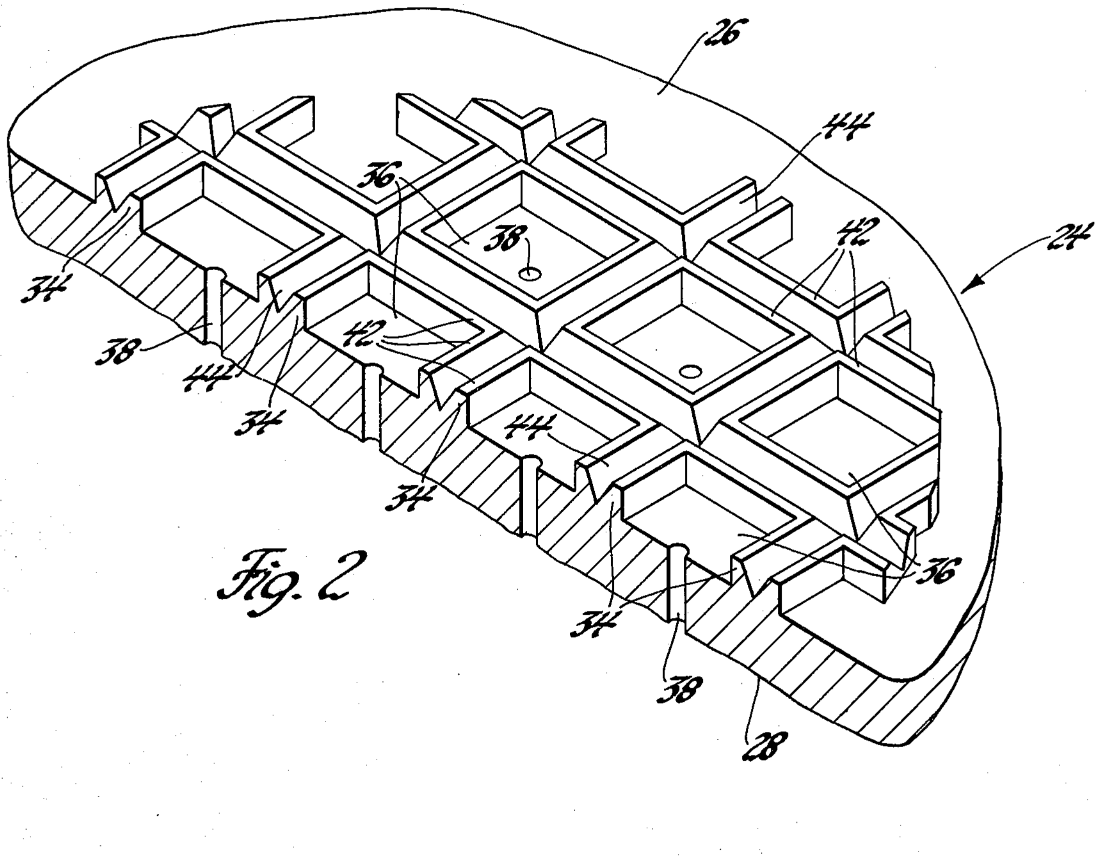
FIG. 2 is an enlarged fragmentary isometric view showing the alignment chuck.
Figure 3:
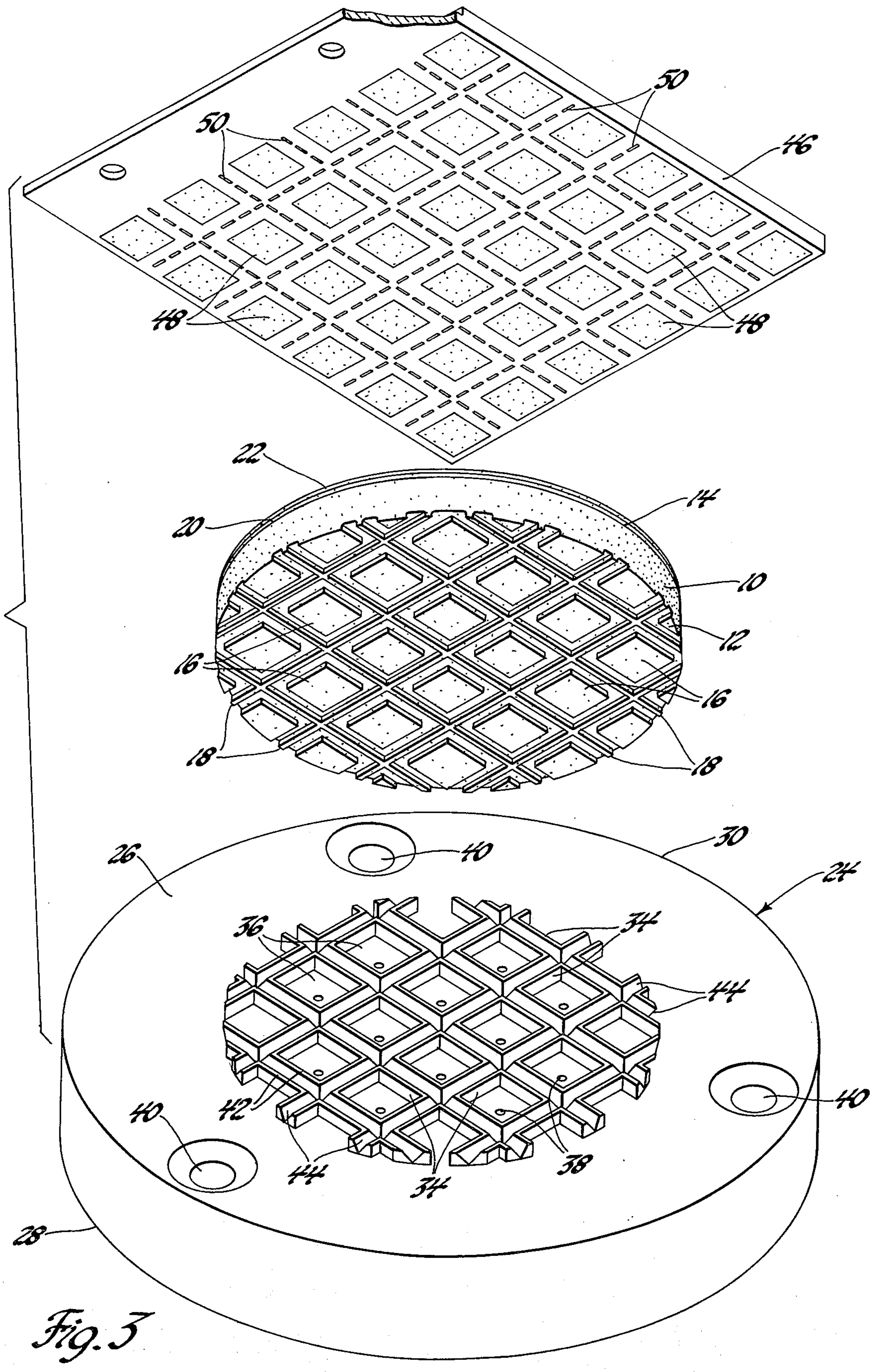
FIG. 3 is an exploded isometric view showing the alignment chuck, a ridged semiconductor wafer and a photomask member of the assembly.

Referring now to the drawings, silicon semiconductor wafer 10 has two major parallel faces 12 and 14. Face 12 contains a plurality of mesa emitters 16 located in parallel rows and columns on face 12 of the wafer 10. The face 12 of the semiconductor wafer containing the emitter regions of the discrete devices is referred to herein as the front side of the wafer. Face 14 of semiconductor wafer 10 is generally flat and forms a common collector region of the plurality of discrete devices in the wafer. This face is designated herein as the back side of the semiconductor wafer. As can be seen in the drawings, a grid pattern of ridges 18 is on the front side of the wafer in the areas between discrete mesa emitters 16.

In such wafers having mesa emitter devices, the ridges do not have to be formed in a separate processing operation. They can be formed at the same time the mesa emitters are being produced. A commonly used method of forming mesa emitters is to apply a photoresist, such as KMER, to the front side of a planar semiconductor wafer on which the mesa emitters are to be formed. A photomask is placed on the front side of the wafer exposing only portions of the wafer where the mesas are to be formed. The photoresist is then developed, which removes the resist from all the wafer portions except those subjected to the ultraviolet light. The wafer is then placed in a chemical etchant to etch away the unprotected portions of the wafer face. The etchant erodes away these regions until a plurality of discrete raised islands, or mesa emitters, on the semiconductor wafer is produced.

To form a pattern of ridges between these mesa emitters, one need only design the photomask to concurrently also expose the photoresist in a desired ridge pattern when the mesa portions are exposed to the ultraviolet light. One then subjects the wafer to the same developing and etching process as described above for the mesa emitters. On development of the resist, the wafer surface is not only protected in the mesa portions, but also in an intersecting grid pattern between them. On etching the wafer face to form the mesa emitters, one concurrently produces a pattern of intersecting ridges between the mesa emitters that are coplanar with the mesas. The ridges 18, in this example, are approximately 0.004 inch wide and 0.001 inch high.

Silicon dioxide ($SiO_2$) layer 20 is approximately 6000 angstroms thick and coextensive with and contiguous the wafer back side 14. Typically, the silicon dioxide layer 20 is formed during a prior diffusion process in which impurity atoms of a selected conductivity type are diffused into the wafer. A photoresist, such as KMER, is applied to the silicon dioxide layer 20. The photoresist layer 22 is approximately 2 to 3 mils thick and is coextensive and contiguous silicon dioxide layer 20.

Attention is now directed to the alignment chuck 24. The chuck 24 is a unitary body having a disc-shaped configuration defined by two parallel major surfaces 26 and 28 and a circumferential periphery 30. While parallelism between surfaces 26 and 28 provides a convenience, parallelism is not required. In fact, surface 28 need not even be flat. The lateral dimensions of the chuck are somewhat variable, and in this illustration, the dimensions of the chuck are chosen to adapt to the base member 32 of the assembly as can be seen in the drawing. The chuck 24 in this example is approximately 1 55/64 inches in diameter with a thickness between the major surfaces of seven thirty-seconds of an inch. The alignment chuck is preferably made of metal, as for example stainless steel.

Extending from surface 26 of the alignment chuck 24 is a plurality of intersecting portions 34. Intersecting portions 34 project approximately one thirty-second of an inch outwardly from major surface 26. The intersecting portions generally correspond to the pattern of ridges 18 on semiconductor wafer 10. That is, they also form a grid pattern with each separate portion intersecting each other at right angles. The plurality of intersecting portions 34 form a circular pattern concentric with the chuck having an effective diameter of approximately 1 3/32 inch which is slightly less than the diameter of semiconductor wafer 10. The reason for this is that during processing of the ridges, when photoresist is applied to wafer back side, photoresist tends to run over the wafer edges onto the front side of the wafer. This results in a loss of definition of the ridges on the outer periphery of the wafer. By making the effective diameter of the plurality of intersecting portions less than the diameter of the wafer, one can still obtain the precision of registration required, and yet avoid the photoresist coated areas toward the outer periphery of the wafer.

Intersecting portions 34 are approximately 0.045 ± 0.005 inch wide. The plurality of intersecting portions define rectangular recess areas 36. As can be seen in the drawings, these recessed areas receive mesa emitters 16. Several of these recessed areas 36 have openings 38 therethrough. Openings 38 extend through the chuck and may be used as passages to a vacuum manifold, if one wishes to hold semiconductor wafer 10 in place during processing. Three countersunk holes 40 facilitate securing the alignment chuck 24 into a supporting base member 32.

Intersecting portions 34 form a grid face 42 which is spaced from major surface 26. Disposed within grid face 42 of the intersecting portions is a grid pattern of grooves 44. Grooves 44 are V-shaped subtending an angle of 60° and precisely correspond with the pattern of ridges on the front side of semiconductor wafer 10. The grooves have a width and depth slightly greater than the width and height of the ridges. In this example, the grooves are approximately 0.0055 ± 0.0005 inch wide and have a depth approximately 0.002 inch. It should be noted that the grooves 44 may be other than V-shaped, the only prerequisite being that they permit fairly tight nesting (± 1½ mils) of the ridges therewithin.

Attention is now referred to photomask 46. The photomask is of a standard transparent material such as glass and has two major parallel faces. On one face is a plurality of opaque squares 48 corresponding to the mesa emitters 16 on the front side of semiconductor wafer 10. On the same face of photomask 46 are very thin, dashed etched crosshairs 50 in the areas between opaque squares 48. Crosshairs 50 are translucent so as not to prevent light from passing through the areas between the opaque squares. The crosshairs correspond to grooves 44 of alignment chuck 24.

Figure 4:
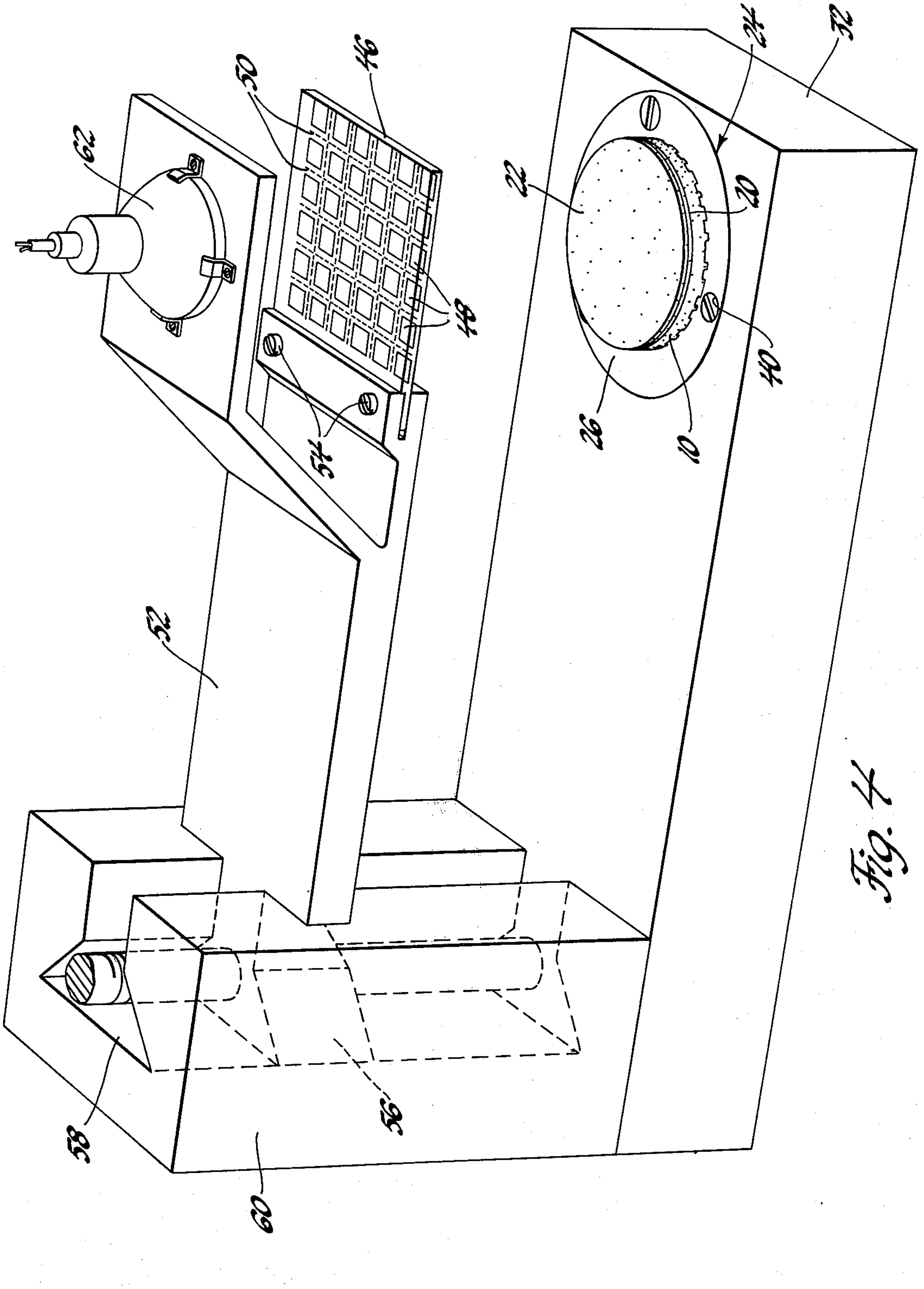
FIG. 4 is a schematic view of the assembly.

As can be seen in FIG. 4, the alignment chuck 24 is disposed within base member 32 so that intersecting portions 34 protrude from the top surface of base member 32. Base member 32 serves as a support structure for the assembly and is constructed of any suitable rigid material. The chuck may be secured to the base member 32 by three screws extending through countersunk holes 40. Photomask 46 is inserted in a slot in one end of a rigid vertically movable arm 52. The photomask is then optically aligned with the alignment chuck 24 below via aligning the crosshairs 50 with the grooves 44 of the chuck. The photomask is secured to the arm 52 as by a series set screws 54 to retain the alignment. Movable arm 52 permits vertical movement of the photomask in relation to the chuck but still retains the alignment therewith. This may be accomplished by the use of a key 56 in the arm 52 and a key way 58 in a post 60. This prevents any lateral movement of the arm but permits vertical movement without disturbing the alignment between the photomask 46 and the chuck 24. It should be noted that other means may be used to accomplish this end. For example, the chuck can be disposed within a support structure having a rigid arm hinged on the periphery of the support. The photomask can be secured to the unhinged end of the arm, thus permitting the photomask to be raised from the chuck but retaining the alignment therewith.

The movable arm 52 with photomask 46 in positive alignment with chuck 24 is raised from the chuck in order to insert semiconductor wafer 10 in the chuck. The front side of the semiconductor wafer 10 whose back side has been previously coated with photoresist is placed face down on face 42 of intersecting portions 34 so that wafer ridges 18 nest in grooves 44 of alignment chuck 24. The nesting of the ridges in the chuck grooves places the wafer in the desired position in relation to the chuck. Since the photomask 46 has been previously aligned with the grooves in the chuck, the opaque squares 48 of the photomask are automatically registered with the emitter regions 16 on the front side of semiconductor wafer 10.

Movable arm 52 with photomask 46 thereon is lowered so that the mask abuts the back side of semiconductor wafer 10. As can be seen in the drawings, opaque squares 48 corrrespond to the mesa emitters 16 on the front side of the wafer. The photoresist layer 22 on the back side of the wafer with the photomask 46 thereon is subjected to an ultraviolet light 62. As can be seen, the entire photoresist layer 22 on the backside of the wafer is exposed except selected areas which are covered by opaque squares 48.

The wafer is then removed and the photoresist is developed by the usual process known in the art. The development of the photoresist forms a plurality of windows within the photoresist layer 22 that expose selected areas of the silicon dioxide layer 20. It should be noted that these selected areas are in alignment with the mesa emitters on the front side of the wafer. The front side of the wafer is then covered with a suitable maskant such as wax. The wafer is then submersed in an etchant and the windows of silicon dioxide within the photoresist layer 22 are etched away. These etched areas extend through the silicon dioxide layer 20 so as to expose selected areas of silicon on the backside of semiconductor wafer 10.

The remaining photoresist of photoresist layer 22 is then removed as by known photoresist strippers and trichloroethylene rinses. The remaining silicon dioxide of the silicon dioxide layer 22 serves as a mask in the following metal deposition step.

Nickel is then electrolessly plated onto the selected areas on the backside of the wafer. The nickel will not adhere to the silicon dioxide, but will adhere to the silicon of these selected areas. Hence, the nickel has been selectively deposited on these areas on the back side of the wafer. This plurality of selectively deposited metallic coatings serve as solderable electrodes for the collector region of the discrete devices. It should be noted also that these selective nickel coatings are outside the etch lines or portions that are to be subsequently etched, so that the discrete devices now may be separated by the usual etching process and the nickel will not enter the etchant solution. Therefore, the collector-base junctions of the discrete dies will not be contaminated thereby.

Alternate deposition processes may be used as a substitute for electroless plating. For example, after the selected areas of silicon on the wafer back side are exposed and before the photoresist is removed, the metallic coating may be evaporated onto the back side of the wafer. After the evaporation process, the photoresist can be stripped from the back side, as hereinbefore explained, leaving the metal coating only the selected areas of silicon on the wafer back side.

It should be noted that although nickel has been found to be the most practical metal to use in production, other metals may be substituted therefor such as gold. Furthermore, it should be evident to one skilled in the art that this assembly and method of using it may be easily adapted to current alignment machines, such as a Kulicke-Soffa Alignment Mahine. Therefore, it is to be understood that although this invention was described by a certain specific example thereof, no limitation is intended thereby except as defined in the appended claims.

It is claimed:

1. Apparatus for automatically aligning a semiconductor wafer back side photomask that is complementary to and in precise registration with a plurality of emitter mesas on the front side of the wafer, said apparatus comprising:

an alignment chuck having a face for receiving the front side of a circular semiconductor wafer having a plurality of emitter mesas on its front side and a grid pattern of intersecting ridges between and spaced from the emitter mesas;

a pattern of intersecting ridges on said chuck face corresponding to said grid pattern on said wafer and forming a plurality of recesses in said chuck face corresponding to said emitter mesas;

a pattern of intersecting grooves in said chuck ridges corresponding to said wafer ridges, said chuck grooves having a V-shaped cross section with a depth and width slightly greater than the height and width of the wafer ridges, whereby said wafer ridges and emitter mesas can nest within said chuck grooves and recesses, respectively, and automatically align said wafer with said chuck;

a generally circular outer periphery on said pattern of chuck ridges of a diameter slightly less than the diameter of said wafer so as to avoid engagement with peripheral portions of said wafer which may not have well-defined ridges;

a support that is movable into and out of a predetermined position that is adjacent said chuck;

means for automatically guiding said movable support into said predetermined position adjacent said chuck;

a wafer back side photomask that is complementary to said wafer front side;

means fixing said photomask to said movable support whereby movement of said support into said predetermined position moves said photomask into contact with the back side of a wafer whose front side is nested in said chuck grooves and recesses; and said photomask precisely aligned with said chuck grooves when said support is in said predetermined position, and thereby automatically precisely aligned with a wafer front side nested in said chuck grooves and recesses.

* * * * *